United States Patent
Nakanishi

(10) Patent No.: US 10,819,043 B2
(45) Date of Patent: Oct. 27, 2020

(54) WIRELESS COMMUNICATION DEVICE, WIRELESS COMMUNICATION METHOD AND PROGRAM

(71) Applicant: NEC Platforms, Ltd., Kawasaki-shi, Kanagawa (JP)

(72) Inventor: Katsuhiko Nakanishi, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 26 days.

(21) Appl. No.: 16/339,770

(22) PCT Filed: Oct. 16, 2017

(86) PCT No.: PCT/JP2017/037302
§ 371 (c)(1),
(2) Date: Apr. 5, 2019

(87) PCT Pub. No.: WO2018/074392
PCT Pub. Date: Apr. 26, 2018

(65) Prior Publication Data
US 2019/0312361 A1    Oct. 10, 2019

(30) Foreign Application Priority Data
Oct. 18, 2016 (JP) .................................. 2016-204084

(51) Int. Cl.
*H01Q 21/30* (2006.01)
*H03K 17/955* (2006.01)
(Continued)

(52) U.S. Cl.
CPC ........... *H01Q 21/30* (2013.01); *H03K 17/955* (2013.01); *H04B 1/006* (2013.01); *H04B 1/3827* (2013.01)

(58) Field of Classification Search
CPC .......... H01Q 21/00; H01Q 21/30; H01Q 1/50; H01Q 1/53; H01Q 3/24
See application file for complete search history.

(56) References Cited

U.S. PATENT DOCUMENTS

2011/0298674 A1* 12/2011 Hsu ...................... H01Q 1/2266
343/703
2012/0071203 A1* 3/2012 Wong .................... H01Q 21/28
455/550.1
(Continued)

FOREIGN PATENT DOCUMENTS

| JP | 2012-216995 A | 11/2012 |
| JP | 2013-130420 A | 7/2013 |
| JP | 2014-082735 A | 5/2014 |

OTHER PUBLICATIONS

International Search Report for PCT Application No. PCT/JP2017/037302, dated Dec. 26, 2017.
(Continued)

*Primary Examiner* — Hoang V Nguyen

(57) ABSTRACT

To realize a wireless communication device enabling efficient mounting of a proximity sensor, the present invention is provided with: a first antenna; a second antenna which serves also as an electrode for detecting approach of an object; a wireless communicator for performing wireless communication with a connection destination, which uses the second antenna as an auxiliary in the communication, while being capable of performing the communication using the first antenna only; a detector for detecting approach of an object to the second antenna; a switch which couples the second antenna with either of the wireless communicator and the detector; and a controller for setting maximum transmission output of the wireless communicator at a predetermined value, on the basis of approach information on the object which is obtained by coupling of the second antenna with the detector performed by the switch, at a predetermined time interval.

10 Claims, 3 Drawing Sheets

(51) Int. Cl.
    *H04B 1/00*     (2006.01)
    *H04B 1/3827*   (2015.01)

(56) References Cited

U.S. PATENT DOCUMENTS

| | | | |
|---|---|---|---|
| 2012/0196549 A1* | 8/2012 | Hsu | H04B 1/3838 455/90.2 |
| 2012/0252378 A1 | 10/2012 | Teshima | |
| 2014/0087786 A1 | 3/2014 | Tani et al. | |
| 2015/0234077 A1* | 8/2015 | Komulainen | G01V 3/08 324/629 |

OTHER PUBLICATIONS

English translation of Written opinion for PCT Application No. PCT/JP2017/037302.

* cited by examiner

WIRELESS COMMUNICATION DEVICE, WIRELESS COMMUNICATION METHOD AND PROGRAM

This application is a National Stage Entry of PCT/JP2017/037302 filed on Oct. 16, 2017, which claims priority from Japanese Patent Application 2016-204084 filed on Oct. 18, 2016, the contents of all of which are incorporated herein by reference, in their entirety.

TECHNICAL FIELD

The present invention relates to a wireless communication device, a wireless communication method and a program.

BACKGROUND ART

On wireless communication devices used in the vicinity of a human body, such as a mobile phone, a smartphone and a notebook computer, a regulation value is prescribed by the national government in terms of SAR (Specific Absorption Rate) for radio waves transmitted by the wireless communication devices.

SAR represents the amount of energy absorbed by a unit mass of tissue per unit time when the human body is exposed to radio waves. The SAR value generally increases when a radio wave transmission part, usually a transmission antenna, approaches a human body.

In this respect, there is a technology described in Patent Literature 1 (PTL 1) as a technology for keeping SAR for a wireless communication device lower than a regulation value even when the transmission antenna and a human body become close to each other.

The technology disclosed in PTL 1 enables keeping SAR for a wireless communication device lower than a regulation value, by reducing transmission output of the wireless communication device when a sensor has detected that the wireless communication device is close to a human body.

CITATION LIST

Patent Literature

[PTL 1] Japanese Laid-Open Patent Application No. 2014-82735

SUMMARY OF INVENTION

Technical Problem

However, in the wireless communication device of PTL 1, in order to use one electrode as both that for a transmission antenna and that for a capacitive sensor, a filter circuit is inserted on each of the side of a wireless communication circuit and the side of the capacitive sensor. As a result, according to FIG. 1 of PTL 1, the total number of components, including inductors and capacitors, is as large as six, and there accordingly arises an issue in securing a mounting space on a printed wiring board or the like.

An objective of the present invention is to provide a wireless communication device, a wireless communication method and a program which solve the inefficiency in mounting of such a proximity sensor.

Solution to Problem

To achieve the objective described above, a wireless communication device of the present invention includes: a first antenna; a second antenna which serves also as an electrode to detect approach of an object; a wireless communication means which performs wireless communication with a connection destination, where the wireless communication means uses the second antenna as an auxiliary in the communication, while it can perform the communication using the first antenna only; a detection means which detects approach of the object to the second antenna; a switch which couples the second antenna to either of the wireless communication means and the detection means; and a control means which sets maximum transmission output of the wireless communication means at a predetermined value, on the basis of approach information on the object which is obtained by coupling of the second antenna with the detection means performed by the switch and by detection performed by the detection means, at a predetermined time interval.

To achieve the objective described above, a wireless communication method of the present invention includes: performing wireless communication using a first antenna constantly coupled to a wireless communication means; changing coupling of a second antenna coupled with the wireless communication means and accordingly operating as an auxiliary to the first antenna, into coupling with a detection means, at a predetermined time interval; and performing communication by setting maximum transmission output of the wireless communication means at a predetermined value, on the basis of approach information on an object detected by the detection means.

To achieve the objective described above, a program of the present invention includes: performing wireless communication using a first antenna constantly coupled to a wireless communication means; changing coupling of a second antenna coupled with the wireless communication means and accordingly operating as an auxiliary to the first antenna, into coupling with a detection means, at a predetermined time interval; and performing communication by setting maximum transmission output of the wireless communication means at a predetermined value, on the basis of approach information on an object detected by the detection means.

Advantageous Effects of Invention

According to the wireless communication device, the wireless communication method and the program of the present invention, it becomes possible to mount a proximity sensor efficiently compared with the related art.

EXAMPLE EMBODIMENT

First Example Embodiment

Next, a first example embodiment of the present invention will be described in detail, with reference to FIGS. 1 and 2.

Description of Configuration

Figure 1:
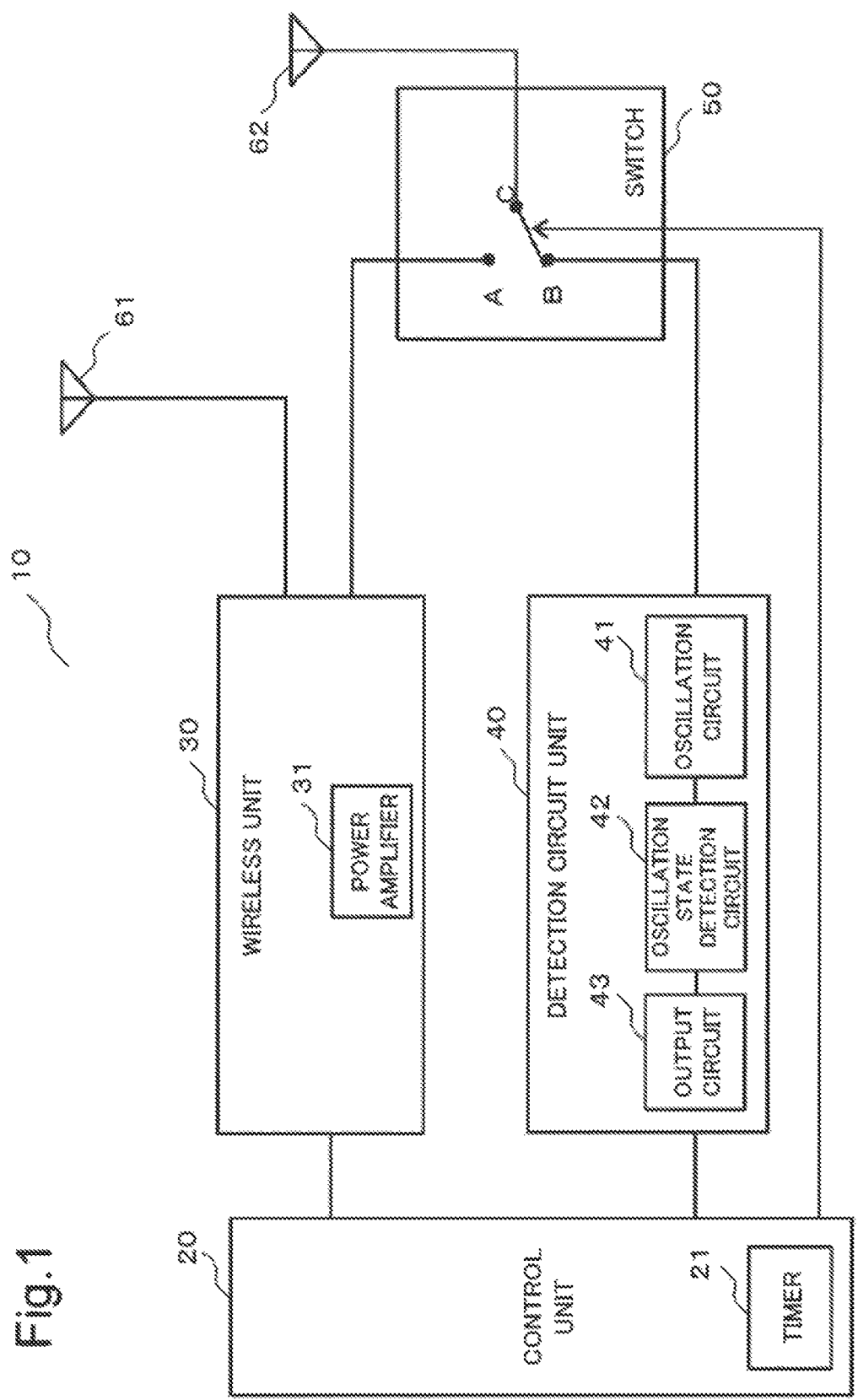
FIG. 1 is a diagram showing an example of a configuration of a first example embodiment.

A configuration of the first example embodiment is shown in FIG. 1.

A wireless communication device 10 of the present example embodiment includes a control unit 20, a wireless unit 30, a detection circuit unit 40, a switch 50, a main antenna 61 and a sub antenna 62.

The control unit 20 is a control means including a CPU (Central Processing Unit) which controls each of the constituent elements of the wireless communication device 10. The control unit 20 is provided with a timer 21. The timer 21 is a timing means which transmits a signal indicating an end of timing when a preset time has elapsed since the start of the timing.

The wireless unit 30 is a wireless circuit which establishes and performs wireless communication with a connection destination of the wireless communication device 10. The wireless unit 30 performs the communication using an LTE (Long Term Evolution) communication method, and is provided with input terminals for the main antenna used in both transmission and reception and for the sub antenna used in reception only.

Here, the wireless unit 30 may use any communication method which is other than that using LTE but is capable of performing communication using only the main antenna even when the sub antenna stops operating. In that case, the sub antenna may be used not for reception only but for both transmission and reception.

Further, the wireless unit 30 includes a power amplifier 31 which is an amplifier for radio wave emission performed by the wireless communication device 10. The input/output terminal for the main antenna in the wireless unit 30 is coupled with the main antenna 61, and the input terminal for the sub antenna in the wireless unit 30 is coupled with the switch 50.

The detection circuit unit 40 is a detection circuit for a proximity sensor to detect approach of a human body, and a proximity sensor in the present example embodiment is a capacitive one.

The capacitive proximity sensor detects approach of an object by a principle described below.

When a voltage against the ground is applied to an electrode, which is a conductor, an electric field is generated between the electrode and the ground.

When an object of a dielectric or conductor material is present in the electric field, a polarization is generated within the object. That is, when the voltage applied to the electrode is positive, negative electric charges accumulate on the side near the electrode and positive electric charges accumulate on the side distant from the electrode, within the object.

Accordingly, when such an object to generate polarization is present in the electric field, the capacitance between the electrode and the ground becomes larger than that of when the object is absent. Further, because the electric field increases with decreasing distance from the electrode, influence of the polarization increases as the object becomes closer to the electrode.

Most of capacitive proximity sensors use an oscillation circuit as a detection circuit for them, where the oscillation circuit is configured such that an electrode is provided at one terminal of the oscillation circuit, the other terminal is coupled to the ground of the oscillation circuit, and the capacitance between the electrode and the ground becomes an element of the oscillation condition. The oscillation circuit is accordingly configured such that its oscillation starts or stops depending on magnitude of the capacitance value.

To realize such a proximity sensor, the detection circuit unit 40 includes an oscillation circuit 41, an oscillation state detection circuit 42 and an output circuit 43. The oscillation circuit 41 is a CR oscillation circuit constituted by a combination of a resistor and a capacitor formed between the electrode and the ground. The oscillation circuit 41 starts oscillating when an object becomes close to the electrode, as a result of increase in the capacitance, and stops oscillating when the object becomes distant from the electrode, as a result of decrease in the capacitance. Here, the electrode coupled with the detection circuit unit 40 in the present example embodiment is the sub antenna 62, which is coupled via the switch 50.

The oscillation state detection circuit 42 is a circuit for detecting an oscillation signal of the oscillation circuit 41. The output circuit 43 is a circuit for outputting the oscillation signal detected by the oscillation state detection circuit 42 to the control unit 20.

The switch 50 includes three terminals, and is a switch with consideration to high frequency characteristics because of its transmitting high frequency signals between the wireless unit 30 and the sub antenna 62.

In the switch 50, as shown in FIG. 1, the sub antenna 62 is coupled to a terminal C, the wireless unit 30 to a terminal A, and a terminal B is coupled to the detection circuit unit 40. Further, the switch 50 changes connection of the terminal C between connection with the terminal A and that with the terminal B, according to a signal output from the control unit 20.

The main antenna 61 is a first antenna for transmission and reception of radio waves by the wireless unit 30, and may be a planar antenna provided within the wireless communication device 10 or a wire antenna, such as a whip antenna, provided outside the housing of the wireless communication device 10. The main antenna 61 is constantly in operation during communication performed by the wireless unit 30.

The sub antenna 62 is a second antenna. The sub antenna 62 may be a planar antenna provided within the wireless communication device 10 or a wire antenna, such as a whip antenna, provided outside the housing of the wireless communication device 10.

The sub antenna 62 is an antenna for improving communication performance by its operating simultaneously with the main antenna 61 when the wireless unit 30 performs the communication, compared to the communication using only the main antenna 61. The sub antenna 62 may be used for reception only or for both transmission and reception, depending on a communication method.

Further, when coupled with the detection circuit unit 40 via the switch 50, the sub antenna 62 serves also as the electrode of the capacitive proximity sensor.

Description of Operation

Next, operation of the present example embodiment will be described with reference to FIGS. 1 and 2.

Figure 2:
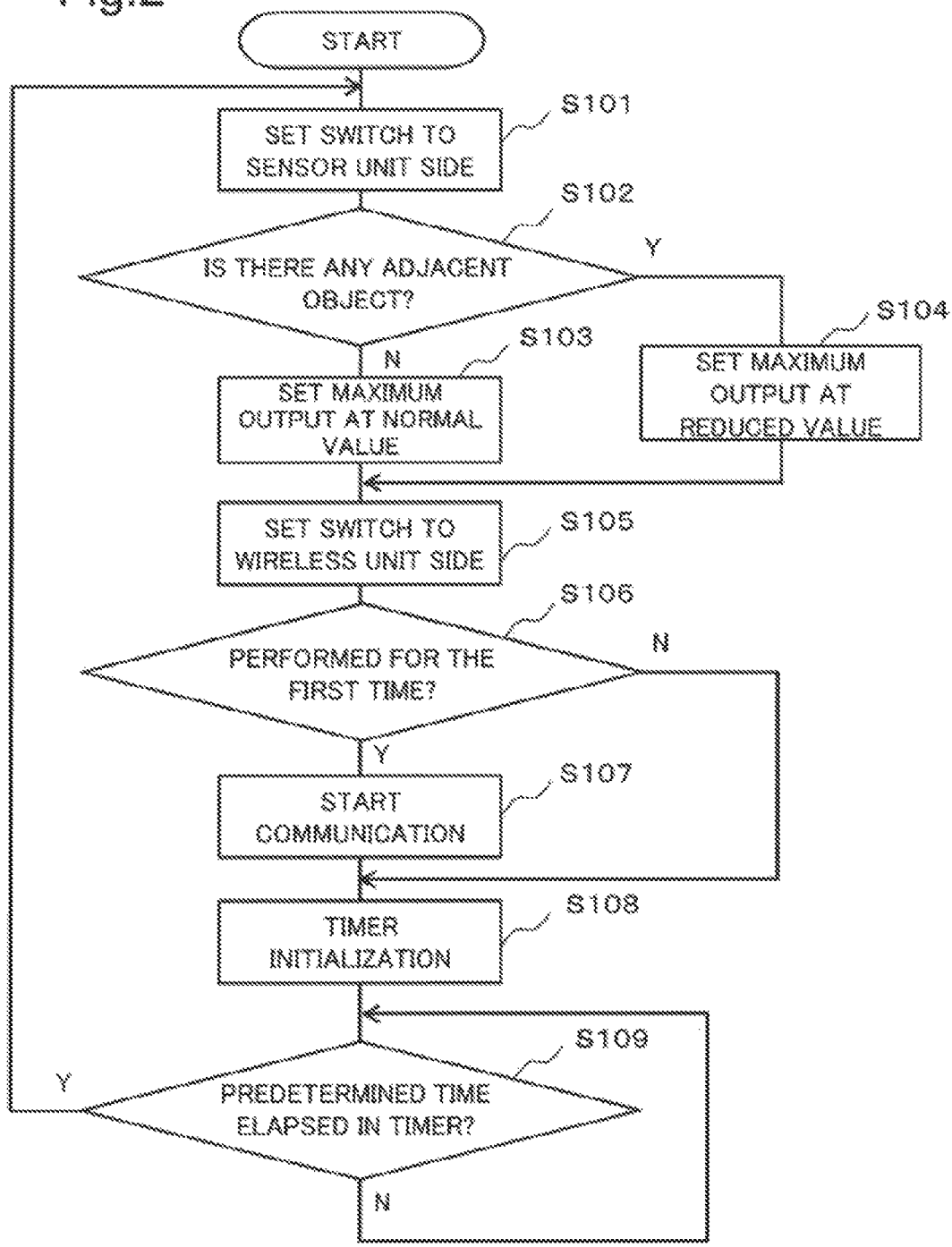
FIG. 2 is a diagram showing operation of the first example embodiment.

FIG. 2 is a flow chart illustrating operation of the wireless communication device 10 of the present example embodiment.

Here, it is assumed that even when the wireless communication device 10 is executing any step of FIG. 2, a user of the wireless communication device 10 may end the wireless communication.

In FIG. 2, when the user starts using the wireless communication device 10, the control unit 20 sends the switch 50 a signal of instructing it to set itself to the side of the detection circuit unit 40, that is, to establish connection between the terminals B and C. As a result, the sub antenna 62 is coupled with the detection circuit unit 40 and accordingly functions as an electrode of the capacitive proximity sensor (S101).

Here, a ground between which and the sub antenna 62 an electric field is to be generated is a ground of the detection circuit unit 40, which may be formed on a printed circuit board in the wireless communication device 10.

In a step S102, the control unit 20 sends the detection circuit unit 40 a signal of causing the detection circuit unit 40 to operate and, as a result, the detection circuit unit 40 detects whether an object such as a human body is close to the sub antenna 62. A method of detecting an adjacent object has already been described in "Description of Configuration". The detection circuit unit 40 outputs a detection result to the control unit 20, and subsequently stops operating (S102).

If, in the step 102, the control unit 20 determines that no object is close to the sub antenna 62 (N at S102), the control unit 20 sends the wireless unit 30 a signal of instructing it to set maximum output of the power amplifier 31 at a predetermined normal value (S103).

Here, the value thus referred to as a predetermined normal value to be set to the power amplifier 31 is a value which is set within a legislative regulation value prescribed on the wireless communication device 10 in a case of having no human body close to it, and is a value close to an upper limit of the regulation value.

The wireless unit 30 usually performs communication with its output being changed within a range lower than the maximum output, depending on communication conditions.

If, in the step S102, the control unit 20 determines that any object is close to the sub antenna 62 (Y at S102), the control unit 20 sends the wireless unit 30 a signal of instructing it to set output of the power amplifier 31 at a predetermined reduced value (S104).

Here, the value thus referred to as a predetermined reduced value to be set to the power amplifier 31 is acquired by measuring, in advance, SAR in a case a human body is close to the wireless communication device 10. Then, the predetermined reduced value is a value by which maximum transmission output of the power amplifier 31 is made to be lower than the normal value and, thereby, an SAR value due to radio waves transmitted from the main antenna 61 is made to be lower than a regulation value.

In a step S105 subsequent to the step S103 or the step S104, the control unit 20 sends the switch 50 a signal of instructing it to set itself to the side of the wireless unit 30, that is, to establish connection between the terminal A and the terminal C. As a result, the sub antenna 62 functions as a sub antenna of the wireless unit 30 (S105).

In a step S106, the control unit 20 determines whether the process from the step S101 to the step S105 has been performed for the first time (S106).

If, in the step S106, the process is determined to have been performed for the first time (Y at S106), the control unit 20 sends the wireless unit 30 a signal of instructing it to start communication, and the wireless unit 30 accordingly establishes communication with a connection destination and starts the communication (S107).

If, in the step S106, the process is determined to have been performed not for the first time (N at S106), the flow proceeds to a step S108.

In the step S108, the control unit 20 initializes the timer 21, and the timer 21 starts timing (S108).

The timer 21 determines whether a predetermined time set to it in advance has elapsed (S109).

Here, when the predetermined time is set to be short, an effect of improving the communication performance achieved by the use of the sub antenna 62 for communication is reduced and, when set to be long, an interval of detecting approach of an object such as a human body becomes long. Taking these facts into consideration, the predetermined time is set.

If, in the step S109, the predetermined time is determined to have not elapsed (N at S109), the flow returns to the step S109.

If, in the step S109, the predetermined time is determined to have elapsed (Y at S109), the timer 21 sends the control unit 20 a signal of timing completion, and the flow returns to the step S101.

Returning from the step S109 to the step S101, detection of approach of an object is performed again in the step S102, and output of the power amplifier 31 is set in the step S103 or the step S104. Then, in the step 105, the sub antenna 62 is coupled with the wireless unit 30 again and accordingly is used for communication of the wireless unit 30.

Here, during communication performed by the wireless communication device 10, the sub antenna 62 does not contribute to communication of the wireless unit 30 since the step S101 until the step S105. However, because the main antenna 61 continues operating even during the period where the sub antenna 62 does not contribute to the wireless communication, the communication can be continued, while the communication performance is deteriorated temporarily.

As has been described above, by using a switch instead of using a filter circuit such as described in PTL 1, the wireless communication device 10 of the present example embodiment enables mounting of a proximity sensor with a smaller number of components than in PTL 1.

Second Example Embodiment

Figure 3:
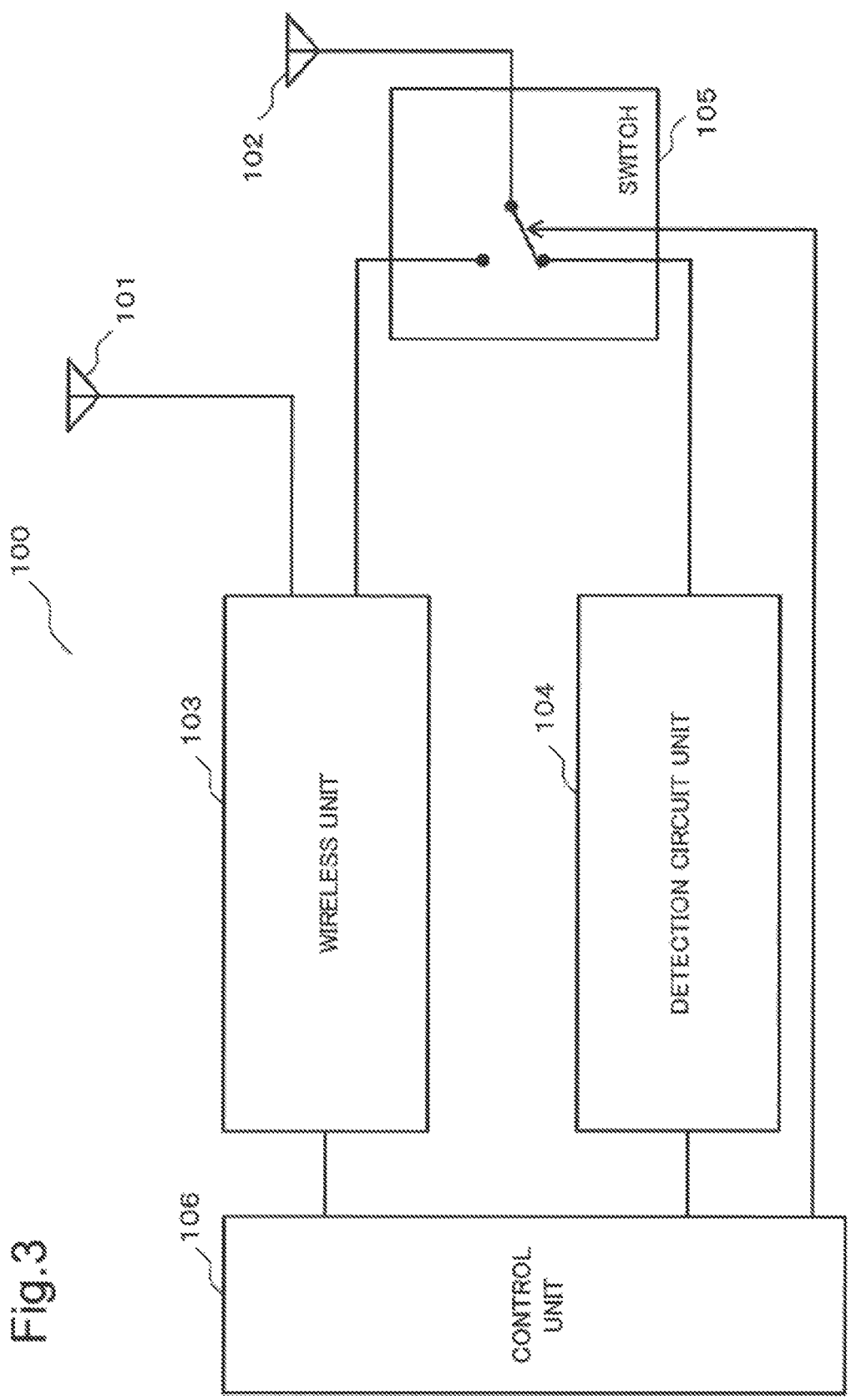
FIG. 3 is a diagram showing an example of a configuration of a second example embodiment.

Next, a second example embodiment will be described with reference to FIG. 3.

A wireless communication device 100 of the present example embodiment includes a first antenna 101 and a second antenna 102 which serves also as an electrode for detecting approach of an object. The wireless communication device 100 also includes a wireless unit 103 which performs wireless communication with a connection destination, where the wireless communication uses the second antenna as an auxiliary in the communication, while it can perform the communication using the first antenna only. The wireless communication device 100 further includes a detection circuit unit 104 which detects approach of the object to the second antenna 102 and a switch 105 which couples the second antenna 102 to either of the wireless communication unit 103 and the detection circuit unit 104. There, the wireless communication device 100 includes a control unit 106. The control unit 106 causes the switch 105 to couple the second antenna with the detection circuit unit 104 at a predetermined time interval. Further, the control unit 106 sets maximum transmission output of the wireless unit 103 at a predetermined value, on the basis of approach information on the object detected by the detection circuit unit 104.

As has been described above, by using a switch instead of using a filter circuit such as described in PTL 1, the wireless communication device 100 of the present example embodiment enables mounting of a proximity sensor with a smaller number of components than in PTL 1.

The example embodiments of the present invention have been described above, but the present invention is not limited to the above-described example embodiments and may be expanded or modified as follows.

In the description of operation of the first example embodiment, the control unit 20 sets maximum transmission output of the power amplifier 31 at a normal value or a reduced value, on the basis of whether the sub antenna 62 has any object close to it, which is detected by the detection circuit unit 40. Here, the detection circuit unit 40 is assumed to be a circuit capable of detecting a distance of closeness of an object. Accordingly, the control unit 20 may set the magnitude of transmission output of the power amplifier 31 in a stepwise or continuous manner, on the basis of the length of the distance of closeness of an object detected by the detection circuit unit 40. In that case, the control unit 20 sets the transmission output such that it is decreased with decreasing the distance of closeness of an object, and increased with increasing the distance of closeness of an object.

The timer initialization performed in the step S108 of FIG. 2, which was mentioned in the description of operation of the first example embodiment, may be performed in a different step. Specifically, it may be performed at any one point among those immediately before the step S101, between the steps S101 and S102, immediately after the branching at the step S102, immediately before the step S105, between the steps S105 and S106, and immediately after the branching at the step S106.

Thus, the present invention has been described taking the above-described example embodiments as exemplary ones. However, the present invention is not limited to the above-described example embodiments. That is, to the present invention, various aspects which can be understood by those skilled in the art may be applied within the scope of the present invention.

This application is based upon and claims the benefit of priority from Japanese Patent Application No. 2016-204084 filed on Oct. 18, 2016, the disclosure of which is incorporated herein in its entirety by reference.

Further, the present invention is applicable also to a case where an information processing program for implementing functions of the example embodiments is supplied to a system or a device directly or remotely.

REFERENCE SIGNS LIST 10 wireless communication device
20 control unit
21 timer
30 wireless unit
31 power amplifier
40 detection circuit unit
41 oscillation circuit
42 oscillation state detection circuit
43 output circuit
50 switch
61 main antenna
62 sub antenna
100 wireless communication device
101 first antenna
102 second antenna
103 wireless unit
104 detection circuit unit
105 switch
106 control unit
A terminal
B terminal
C terminal

What is claimed is:

1. A wireless communication device comprising:
a first antenna;
a second antenna configured to serve also as an electrode for detecting approach of an object;
a wireless communicator configured to perform wireless communication with a connection destination, the wireless communicator performing the wireless communication using the second antenna as an auxiliary in the communication, while being capable of performing the communication even using the first antenna only;
a detector configured to detect approach of an object to the second antenna;
a switch configured to couple the second antenna with either of the wireless communicator and the detector; and
a controller configured to set maximum transmission output of the wireless communicator at a predetermined value, on the basis of approach information on the object which is obtained by coupling of the second antenna with the detector performed by the switch and by detection performed by the detector, at a predetermined time interval.

2. The wireless communication device according to claim 1,
wherein the approach information is whether being closer than a predetermined distance, and
wherein the predetermined value is determined to be a predetermined normal value when not being closer than the predetermined distance, and to be a predetermined reduced value smaller than the normal value when being closer than the predetermined distance.

3. The wireless communication device according to claim 1,
wherein the detector is a detection circuit of a capacitive proximity sensor.

4. The wireless communication device according to claim 1,
wherein the approach information is a distance of closeness, and
wherein magnitude of the predetermined value is set at a value varying stepwise or continuously, on the basis of length of the distance of closeness.

5. A wireless communication method comprising:
performing wireless communication using a first antenna constantly coupled with a wireless communicator;
changing coupling of a second antenna coupled with the wireless communicator and thereby operating as an auxiliary to the first antenna, into coupling with a detector at a predetermined time interval; and
performing communication by setting maximum transmission output of the wireless communicator at a predetermined value, on the basis of approach information on an object detected by the detector.

6. The wireless communication method according to claim 5,
wherein the approach information is whether being closer than a predetermined distance, and
wherein the predetermined value is determined to be a predetermined normal value when not being closer than the predetermined distance, and to be a predetermined reduced value smaller than the normal value when being closer than the predetermined distance.

7. The wireless communication method according to claim 5,
wherein the approach information is a distance of closeness, and wherein magnitude of the predetermined value is set at a value varying stepwise or continuously, on the basis of length of the distance of closeness.

8. A recording medium storing a program for causing a computer to execute:
- performing wireless communication using a first antenna constantly coupled with a wireless communicator;
- changing coupling of a second antenna coupled with the wireless communicator and thereby operating as an auxiliary to the first antenna, into coupling with a detector at a predetermined time interval; and
- performing communication by setting maximum transmission output of the wireless communicator at a predetermined value, on the basis of approach information on an object detected by the detector.

9. The recording medium storing a program according to claim 8,
- wherein the approach information is whether being closer than a predetermined distance, and
- wherein the predetermined value is determined to be a predetermined normal value when not being closer than the predetermined distance, and to be a predetermined reduced value smaller than the normal value when being closer than the predetermined distance.

10. The recording medium storing a program according to claim 8,
- wherein the approach information is a distance of closeness, and
- wherein magnitude of the predetermined value is set at a value varying stepwise or continuously, on the basis of length of the distance of closeness.

* * * * *